(12) United States Patent
Ogata et al.

(10) Patent No.: US 7,656,026 B2
(45) Date of Patent: Feb. 2, 2010

(54) SEMICONDUCTOR DEVICE

(75) Inventors: Yoshiharu Ogata, Sakata (JP);
Yoshikatsu Soma, Sakata (JP);
Hiroharu Kondo, Sakata (JP);
Munehide Saimen, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/168,438

(22) Filed: Jul. 7, 2008

(65) Prior Publication Data

US 2009/0020867 A1     Jan. 22, 2009

(30) Foreign Application Priority Data

Jul. 18, 2007    (JP)   ............... 2007-186838

(51) Int. Cl.
*H01L 23/34*     (2006.01)

(52) U.S. Cl. ............... 257/712; 257/718; 257/E33.075

(58) Field of Classification Search ................ 257/675, 257/706–707, 712, 714, 718, 720–722, E33.075, 257/E31.131, 713, 796
See application file for complete search history.

(56) References Cited

U.S. PATENT DOCUMENTS 6,223,815 B1 *    5/2001    Shibasaki ................ 165/185

6,703,702 B2    3/2004    Inoue et al.

FOREIGN PATENT DOCUMENTS

| JP | 2000-164792 | 6/2000 |
| JP | 2002-124607 | 4/2002 |
| JP | 2003-115568 | 4/2003 |

* cited by examiner

*Primary Examiner*—Davienne Monbleau
*Assistant Examiner*—Hoa B Trinh
(74) *Attorney, Agent, or Firm*—Harness, Dickey & Pierce, P.L.C.

(57) ABSTRACT

A semiconductor device, includes: a wiring substrate having a wiring pattern on a front surface thereof; a first semiconductor chip mounted on the front surface of the wiring substrate; a first heat radiator having a first recess housing the first semiconductor chip and making contact with the front surface of the wiring substrate and the first semiconductor chip directly or with a first insulation layer; a second heat radiator making contact with a rear surface of the wiring substrate directly or with a second insulation layer; and a first fixing member passing through the first heat radiator, the wiring substrate, and the second heat radiator, and pressing the first heat radiator and the second heat radiator to the wiring substrate.

5 Claims, 4 Drawing Sheets

SEMICONDUCTOR DEVICE

The entire disclosure of Japanese Patent Application No. 2007-186838, filed Jul. 18, 2007 is expressly incorporated by reference herein.

BACKGROUND

1. Technical Field

The present invention relates to a semiconductor device including a wiring substrate having a semiconductor chip mounted thereto, and a heat radiator. In particular, the invention relates to a semiconductor device having high heat radiation performance and high reliability.

2. Related Art

Semiconductor chips, such as drivers for display panels, need to secure a sufficient heat radiation ability in being mounted on wiring substrates due to the high heat value. For example, a technique for enhancing heat radiation performance is disclosed in JP-A-2002-124607 (19 to 21 paragraphs and FIG. 2), in which the upper surface of a semiconductor chip is adhesively bonded to a metallic chassis with a heat radiation sheet interposed therebetween, and a heat radiator is fixed to the rear surface of a flexible substrate in a semiconductor device including the flexible substrate having a semiconductor chip mounted on its surface.

In the technique disclosed in JP-A-2002-124607, all most all forces applied either the semiconductor chip or the metallic chassis are directed to a connected portion between the upper surface of the semiconductor chip and the metallic chassis. As a result, a connected portion between the semiconductor chip and the wiring substrate may be peeled off.

In order to solve the problem, there is also a method in which the heat radiator positioned on the surface of the wiring substrate is adhesively bonded to the surface of the wiring substrate. In this case, however, a force applied either the heat radiator or the wiring substrate in the face direction is directed to wiring lines formed on the surface of the wiring substrate. As a result, the wiring lines may be peeled off from the base of the wiring substrate.

In this manner, it is difficult to satisfy both the heat radiation performance and the reliability.

SUMMARY

An advantage of the invention is to provide a semiconductor device having high heat radiation performance and high reliability.

A semiconductor device of the invention includes: a wiring substrate having a wiring pattern on a front surface thereof; a first semiconductor chip mounted on the front surface of the wiring substrate; a first heat radiator having a first recess housing the first semiconductor chip and making contact with the front surface of the wiring substrate and the first semiconductor chip directly or with a first insulation layer; a second heat radiator making contact with a rear surface of the wiring substrate directly or with a second insulation layer; and a first fixing member passing through the first heat radiator, the wiring substrate, and the second heat radiator, and pressing the first heat radiator and the second heat radiator to the wiring substrate.

In the device, heat generated in the first semiconductor chip is transferred to the first heat radiator directly or with the first insulation layer, and also transferred to the first and second heat radiators with the wiring substrate. Heat transferred to the first and second heat radiators is dissipated in air. Consequently, heat generated in the first semiconductor chip can be efficiently dissipated. The first heat radiator is fixed to the wiring substrate with the first fixing member. Because of the structure, a large force is not applied to the first semiconductor chip even when a force is applied to either the wiring substrate or the first heat radiator in a surface direction. As a result, it can be suppressed that the connected portion between the semiconductor chip and a wiring pattern of the wiring substrate is peeled off.

The wiring substrate may be capable of being bended. The wiring board may further include a second fixing member bending the wiring substrate so that the front surface of the wiring substrate makes contact with the first heat radiator. The first heat radiator may have electrical conductivity. The front surface may have a grounding wiring line at a part thereof with which the first heat radiator makes contact by the second fixing member. In this case, the grounding wiring line is grounded by making contact with the first heat radiator, allowing a grounding structure of the grounding wiring line to be simplified.

Each of the first heat radiator and the second heat radiator may have an opposing portion that faces each other and be positioned outside an end portion of the wiring substrate. One of the opposing portions of the first heat radiator and the second heat radiator may have a spacer to keep a clearance between the first heat radiator and the second heat radiator by making contact with the other of the opposing portions of the first heat radiator and the second heat radiator. In this case, it can be suppressed that a force is applied to the surface by the first heat radiator approaching to the surface of the wiring substrate.

The device may further include: an opening provided to the wiring substrate; and a spacer having a protruded shape and being provided to one of the opposing portions of the first heat radiator and the second heat radiator to keep a clearance between the opposing portion of the first heat radiator and the second heat radiator by passing through the opening and making contact with the other of the opposing portions of the first heat radiator and the second heat radiator. In this case, it can also be suppressed that a force is applied to the surface by the first heat radiator approaching to the surface of the wiring substrate.

It is preferable that the first heat radiator make contact with the wiring substrate with the first insulation layer, and the first insulation layer adhere to one of the first heat radiator and the wiring substrate, and do not adhere the other of the first heat radiator and the wiring substrate. In this case, a large force is not applied to the interface of the wiring pattern and the base of the wiring substrate even when a force is applied to either the wiring substrate or the first heat radiator in a surface direction. As a result, it can be suppressed that the wiring pattern is peeled off from the base.

The wiring substrate may have a second wiring pattern on the rear surface thereof, a second semiconductor chip mounted on the rear surface of the wiring substrate, and a second recess provided to the second heat radiator and housing the second semiconductor chip. The second semiconductor chip may make contact with a bottom face of the second recess directly or with a third insulation layer. In this case, heat generated in the second semiconductor chip is dissipated in the same manner of heat generated in the first semiconductor chip.

BRIEF DESCRIPTION OF DRAWINGS

The invention will be described with reference to the accompanying drawings, wherein like numbers reference like elements.

DESCRIPTION OF EXEMPLARY EMBODIMENTS

Figure 1A:
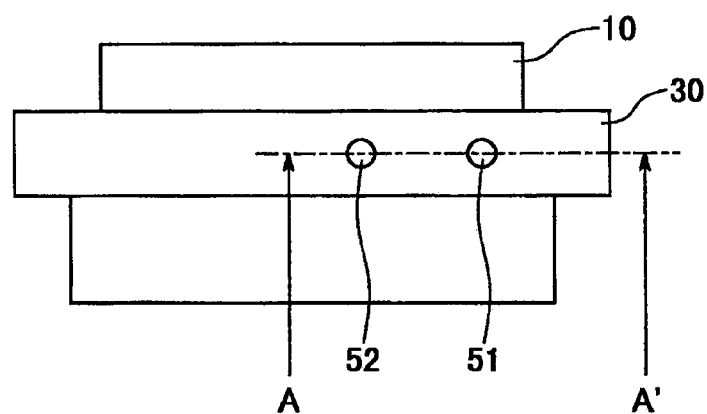
FIGS. 1A and 1B are sectional views for explaining a structure of a semiconductor device according to a first embodiment of the invention.
Figure 1B:
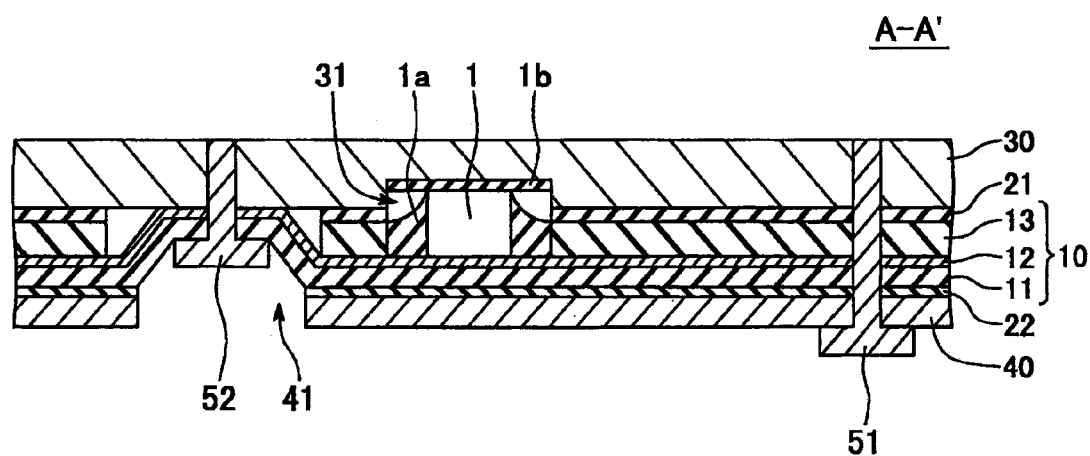

Embodiments of the invention will be described with reference to the accompanying drawings. FIG. 1A is a plan view of a semiconductor device according to a first embodiment of the invention. FIG. 1B is a sectional view taken along the line A-A' of FIG. 1A. A semiconductor chip 1 is mounted on the surface of a flexible substrate 10. The mounting method is a COF method, for example. The semiconductor chip 1 is, for example, a driver for a flat panel display, such as a plasma display and a liquid crystal display, and sealed on the flexible substrate 10 with a resin 1a.

The flexible substrate 10 is composed of a base 11, a wiring pattern 12 formed on the surface of the base 11, and a resist layer 13 covering the wiring pattern 12. The resist layer 13 and an insulation layer 21, which will be described later, do not cover the wiring pattern 12 at a portion in which the semiconductor chip 1 is connected to the flexible substrate 10 and at a periphery of a screw 52, which will de described in detail. Here, a wiring line, located at the periphery of the screw 52, of the wiring patter 12 serves as a grounding wiring line.

A first heat radiating plate 30 makes contact with the front surface of the flexible substrate 10 with an insulation layer 21 having high thermal conductivity interposed therebetween while a second heat radiating plate 40 is bonded on the rear surface of the flexible substrate 10 with a thermal conductive adhesive 22 interposed therebetween. The insulation layer 21 adheres to one of the flexible substrate 10 and the first heat radiating plate 30, but does not adhere to the other one. The insulation layer 21 can prevent the first heat radiating plate 30 and the wiring pattern 12 from being electrically conducted even when the wiring pattern 12 is exposed due to the breakage of the resist layer 13.

A part of heat generated in the semiconductor chip 1 is transferred to the first heat radiating plate 30 and the second heat radiating plate 40 through the flexible substrate 10 and the insulation layer 21 or the adhesive 22. The first heat radiating plate 30 is a metallic plate. The second heat radiating plate 40 is also preferably is a metallic plate. For example, aluminum or cupper is used as a metal for the plate.

The second heat radiating plate 40 has a screw hole while the first heat radiating plate 30 also has a screw hole at a position overlapping with the screw hole of the second heat radiating plate 40. The flexible substrate 10 has an opening (a hole) at a position overlapping with the screw holes. The first heat radiating plate 30 and the second heat radiating plate 40 are pressed to the flexible substrate 10 by a screw 51 inserted through the screw hole of the second heat radiating plate 40, the hole of the flexible substrate 10, and the screw hole of the first heat radiating plate 30. The first heat radiating plate 30 is fixed to the flexible substrate 10. While the screw 51 is inserted from a side adjacent to the second heat radiating plate 40, it may be inserted from a side adjacent to the first heat radiating plate 30. In FIG. 1B, the screw hole formed in the first heat radiating plate 30 passes through the first heat radiating plate 30; however, it may not be a through hole.

The second heat radiating plate 40 has an opening 41 at a portion not overlapping with the semiconductor chip 1 while the first heat radiating plate 30 has a screw hole located inside the opening 41. The flexible substrate 10 has an opening (a hole) at a position overlapping with the screw hole. Passed through the hole of the flexible substrate 10 and the screw hole of the first heat radiating plate 30, the screw 52 bends the flexible substrate 10, resulting in the grounding wiring line of the wiring pattern 12 being made contact with the first heat radiating plate 30. As a result, the grounding wiring line is grounded. The flexible substrate 10 is also fixed to the first heat radiating plate 30 with the screw 52. Here, the diameter of the head of the screw 52 is smaller than the width or the diameter of the opening 41. Therefore, the head of the screw 52 directly makes contact with the rear surface of the flexible substrate 10 without making contact with the second heat radiating plate 40.

The first heat radiating plate 30 has a recess 31 at a portion facing the semiconductor chip 1. On the bottom face of the recess 31, a thermal conductive insulation layer 1b is provided. The semiconductor chip 1 is housed in the recess 31 and makes contact with the bottom face of the recess 31 with the insulation layer 1b interposed therebetween. Such structure satisfies a relationship in which the sum of the depth of the recess 31, the thickness of the insulation layer 21, and the thickness of the resist layer 13 is equal to the sum of the thickness of the semiconductor chip 1 and the thickness of the insulation layer 1b. A part of heat generated in the semiconductor chip 1 is transferred to the first heat radiating plate 30 with the insulation layer 1b interposed therebetween. While the insulation layer 1b adheres to the bottom face of the recess 31, but may not adhere to the semiconductor chip 1.

According to the first embodiment, the semiconductor chip 1 makes contact with the first heat radiating plate 30 with the thermal conductive insulation layer 1b interposed therebetween. Because of this structure, heat generated in the semiconductor chip 1 is directly transferred to the first heat radiating plate 30. In addition, the first heat radiating plate 30 makes contact with the front surface of the flexible substrate 10 with the insulation layer 21 having high thermal conductivity interposed therebetween while the second heat radiating plate 40 makes contact with the rear surface of the flexible substrate 10 with the thermal conductive adhesive 22 interposed therebetween. Because of this structure, a part of heat generated in the semiconductor chip 1 is transferred to the first heat radiating plate 30 through the flexible substrate 10 and the insulation layer 21, and also transferred to the second heat radiating plate 40 through the flexible substrate 10 and the adhesive 22. Heat transferred to the first radiating plate 30 and the second heat radiating plate 40 is dissipated in air, for example.

Consequently, heat generated in the semiconductor chip 1 can be efficiently dissipated.

The first heat radiating plate 30 is fixed to the flexible substrate 10 with the screws 51 and 52 while the second heat radiating plate 40 is fixed to the rear surface of the flexible substrate 10 with the adhesive 22. Because of the structure, a large force is not applied to the semiconductor chip 1 even when a force is applied to either the first heat radiating plate 30 or the second heat radiating plate 40 in the surface direction. As a result, it can be suppressed that the connected portion of the semiconductor chip 1 and the wiring pattern 12 is peeled off. This effect appears remarkably in a case where the insulation layer 1*b* does not adhere to the semiconductor chip 1.

The insulation layer 21 adheres to one of the flexible substrate 10 and the first heat radiating plate 30, but does not adhere to the other one. Because of the structure, a large force is not directed to the interface of the wiring pattern 12 and the base 11 of the flexible substrate 10 even when a force is applied to either the flexible substrate 10 or the first heat radiating plate 30 in the surface direction. As a result, it can be suppressed that the wiring pattern 12 is peeled off from the base 11.

The grounding wiring line of the wiring pattern 12 makes contact with the first heat radiating plate 30 with screw 52, resulting in the grounding wiring line being grounded. As a result, a simple grounding structure of a grounding wiring line can be provided.

Figure 2:
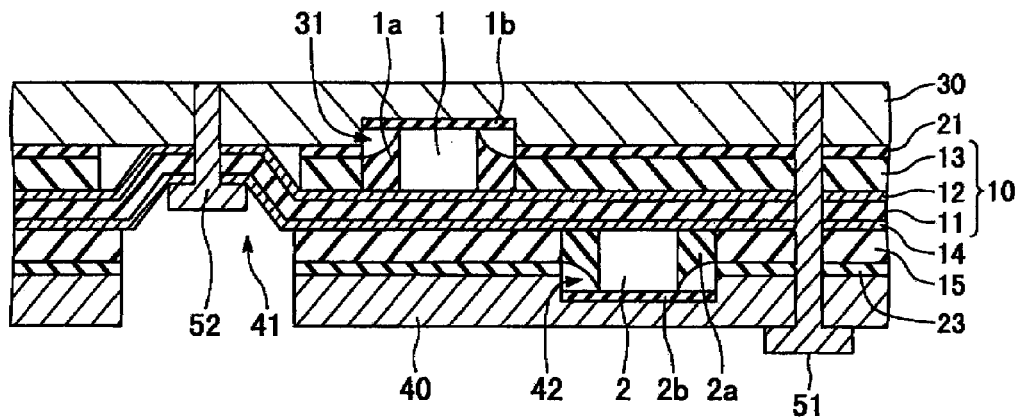
FIG. 2 is a sectional view for explaining a structure of a semiconductor device according to a second embodiment of the invention.

FIG. 2 is a sectional view illustrating a structure of a semiconductor device according to a second embodiment of the invention, and corresponds to FIG. 1B of the first embodiment. The semiconductor device of the second embodiment is nearly the same as that of the first embodiment except that the flexible substrate 10 is a double-side substrate and a semiconductor chip 2 is mounted to the rear surface of the flexible substrate 10 by a COF method. Description of the same structure as that of the first embodiment is omitted.

On the rear surface of the base 11 of the flexible substrate 10, a wiring pattern 14 is formed. The wiring pattern 14 is covered with a resist layer 15. An insulation layer 23 having high thermal conductivity, not an adhesive, is provided to the interface of the flexible substrate 10 and the second heat radiating plate 40. That is, in the second embodiment, the second heat radiating plate 40 is fixed to the rear surface of the flexible substrate 10 with screws 51 and 52. The insulation layer 23 adheres to one of the flexible substrate 10 and the second heat radiating plate 40, but does not adhere to the other one. The insulation layer 23 can prevent the second heat radiating plate 40 and the wiring pattern 14 from being electrically conducted even when the wiring pattern 14 is exposed due to the breakage of the resist layer 15.

The resist layer 15 and the insulation layer 23, which will be described later, do not cover the wiring pattern 14 at a portion in which the semiconductor chip 2 is connected to the flexible substrate 10 and at a periphery of the screw 52. Here, a wiring line, located at the periphery of the screw 52, of the wiring patter 14 serves as a grounding wiring line.

The semiconductor chip 2 is, for example, a driver for a flat panel display, such as a plasma display and a liquid crystal display, and sealed on the flexible substrate 10 with a resin 2*a*.

The second heat radiating plate 40 has a recess 42 at a portion facing the semiconductor chip 2. On the bottom face of the recess 42, a thermal conductive insulation layer 2*b* is provided. The semiconductor chip 2 is housed in the recess 42 and makes contact with the bottom face of the recess 42 with the insulation layer 2*b* interposed therebetween. Such structure satisfies a relationship in which the sum of the depth of the recess 42, the thickness of the insulation layer 23, and the thickness of the resist layer 15 is equal to the sum of the thickness of the semiconductor chip 2 and the thickness of the insulation layer 2*b*.

As described above, the second embodiment can provide the same advantageous effect as that of first embodiment. The semiconductor chip 2 makes contact with the second heat radiating plate 40 with the thermal conductive insulation layer 2*b* interposed therebetween. Because of this structure, heat generated in the semiconductor chip 2 is directly transferred to the second heat radiating plate 40. In addition, a part of heat generated in the semiconductor chip 2 is transferred to the first heat radiating plate 30 through the flexible substrate 10 and the insulation layer 21, and also transferred to the second heat radiating plate 40 through the flexible substrate 10 and the insulation layer 23. Heat transferred to the first radiating plate 30 and the second heat radiating plate 40 is dissipated in air.

Consequently, heat generated in the semiconductor chip 2 can be efficiently dissipated.

The second heat radiating plate 40 is fixed to the flexible substrate 10 with screws 51 and 52. Because of the structure, a large force is not applied to the semiconductor chip 2 even when a force is applied to any one of the flexible substrate 10, the first heat radiating plate 30, and the second heat radiating plate 40 in the surface direction. As a result, it can be suppressed that the connected portion of the semiconductor chip 2 and the wiring pattern 14 is peeled off. This effect appears remarkably in a case where the insulation layer 2*b* does not adhere to the semiconductor chip 2.

The insulation layer 23 adheres to one of the flexible substrate 10 and the second heat radiating plate 40, but does not adhere to the other one. Because of the structure, a large force is not directed to the interface of the wiring pattern 14 and the base 11 of the flexible substrate 10 even when a force is applied to either the flexible substrate 10 or the second heat radiating plate 40 in the surface direction. As a result, it can be suppressed that the wiring pattern 14 is peeled off from the base 11.

Figure 3:
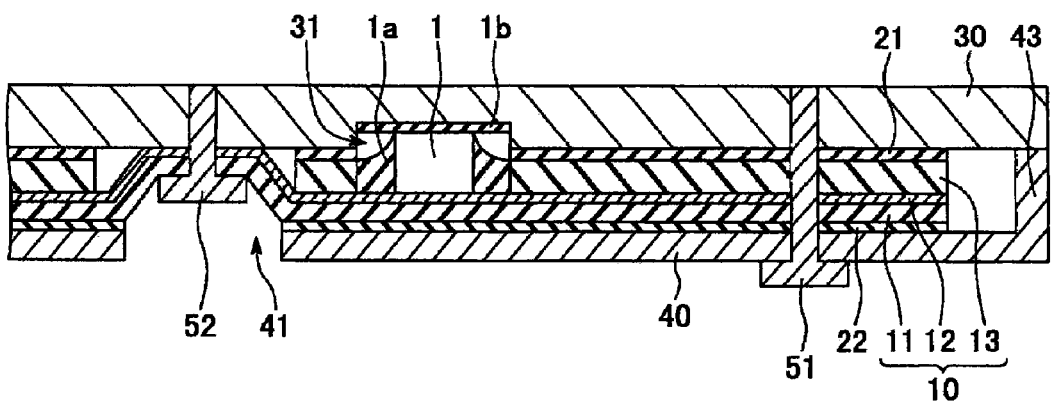
FIG. 3 is a sectional view for explaining a structure of a semiconductor device according to a third embodiment of the invention.

FIG. 3 is a sectional view illustrating a structure of a semiconductor device according to a third embodiment of the invention, and corresponds to FIG. 1B of the first embodiment. A semiconductor device according to the third embodiment is the same as that of the first embodiment except that the end portions of the first heat radiating plate 30 and the second heat radiating plate 40 are positioned outside the end portion of the flexible substrate 10 and faced each other, and a spacer 43 is provided to the end portion of the second heat radiating plate 40. Description of the same structure as that of the first embodiment is omitted.

The spacer 43 is formed in such a manner that the face, facing the first heat radiating plate 30, of the end portion of the second heat radiating plate 40 is protruded toward the first heat radiating plate 30. The upper end face of the spacer 43 butts to the first heat radiating plate 30. As a result, the clearance between the first heat radiating plate 30 and the flexible substrate 10 and the clearance between the second heat radiating plate 40 and the flexible substrate 10 can be kept with the spacer 43.

As described above, the third embodiment can also provide the same advantageous effect as that of the first embodiment. In addition, it can be suppressed a force is applied to the resist layer 13 by the first heat radiating plate 30 approaching to the front surface of the flexible substrate 10 because the clearance between the first heat radiating plate 30 and the flexible substrate 10 can be kept with the spacer 43.

Figure 4:
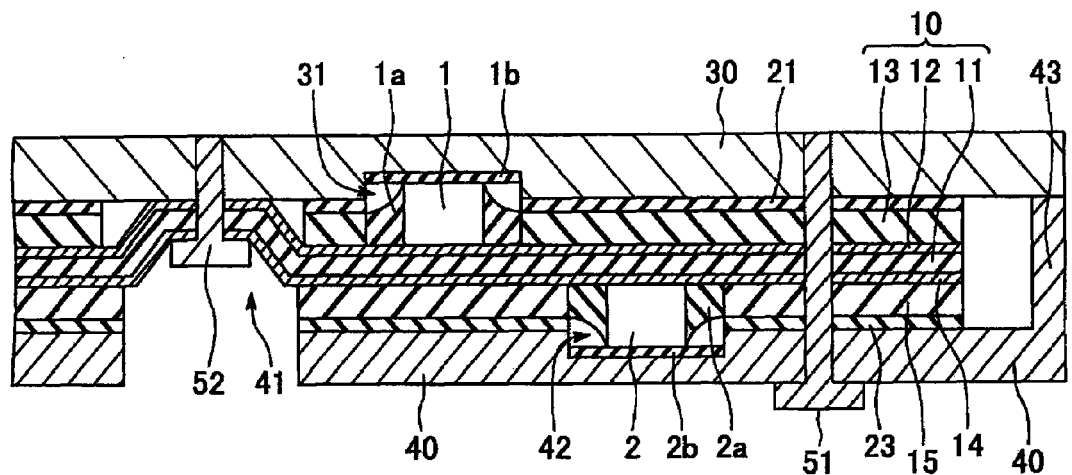
FIG. 4 is a sectional view for explaining a structure of a semiconductor device according to a fourth embodiment of the invention.

FIG. 4 is a sectional view illustrating a structure of a semiconductor device according to a fourth embodiment of the invention, and corresponds to FIG. 2 of the second embodiment. A semiconductor device according to the fourth embodiment is the same as that of the first embodiment except that the end portions of the first heat radiating plate 30 and the second heat radiating plate 40 are positioned outside the end portion of the flexible substrate 10 and faced each other, and the spacer 43 is provided to the end portion of the second heat radiating plate 40 in the same manner shown in the third embodiment. Description of the same structure as that of the second embodiment is omitted.

The third embodiment can also provide the same advantageous effect as that of the second embodiment. In the fourth embodiment, the first heat radiating plate 30 and the second heat radiating plate 40 have the same structure as that in the third embodiment. Thus, each of the clearance between the first heat radiating plate 30 and the flexible substrate 10, and the clearance between the second heat radiating plate 40 and the flexible substrate 10 can be kept with the spacer 43. As a result, it can be suppressed that a force is applied to the resist layers 13 and 15 by the approach of the first heat radiating plate 30 or the second heat radiating plate 40 toward the flexible substrate 10.

Figure 5:
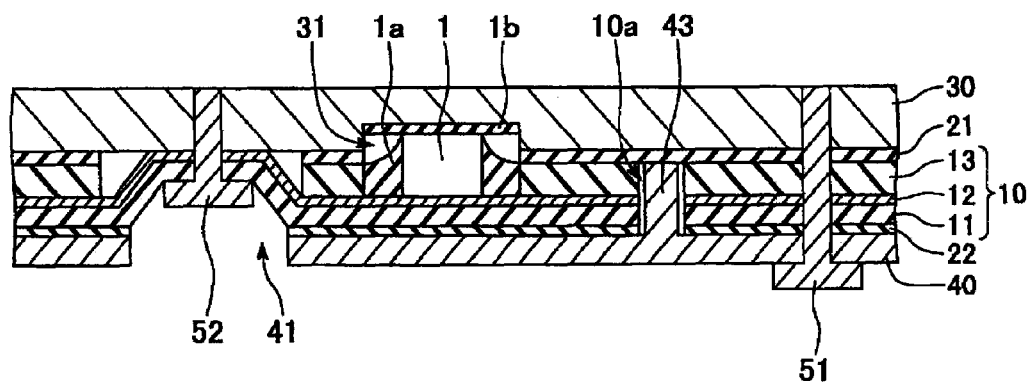
FIG. 5 is a sectional view for explaining a structure of a semiconductor device according to a fifth embodiment of the invention.

FIG. 5 is a sectional view illustrating a structure of a semiconductor device according to a fifth embodiment of the invention, and corresponds to FIG. 3 of the third embodiment. A semiconductor device according to the fifth embodiment is the same as that of the third embodiment except that the end portions of the first heat radiating plate 30 and the second heat radiating plate 40 are the same position of the first embodiment, an opening 10a is provided to the flexible substrate 10, and the spacer 43 is disposed at the position overlapping with the opening 10a and passes through the opening 10a to butt to the first heat radiating plate 30. Description of the same structure as that of the third embodiment is omitted.

The fifth embodiment can also provide the same advantageous effect as that of the third embodiment.

Figure 6:
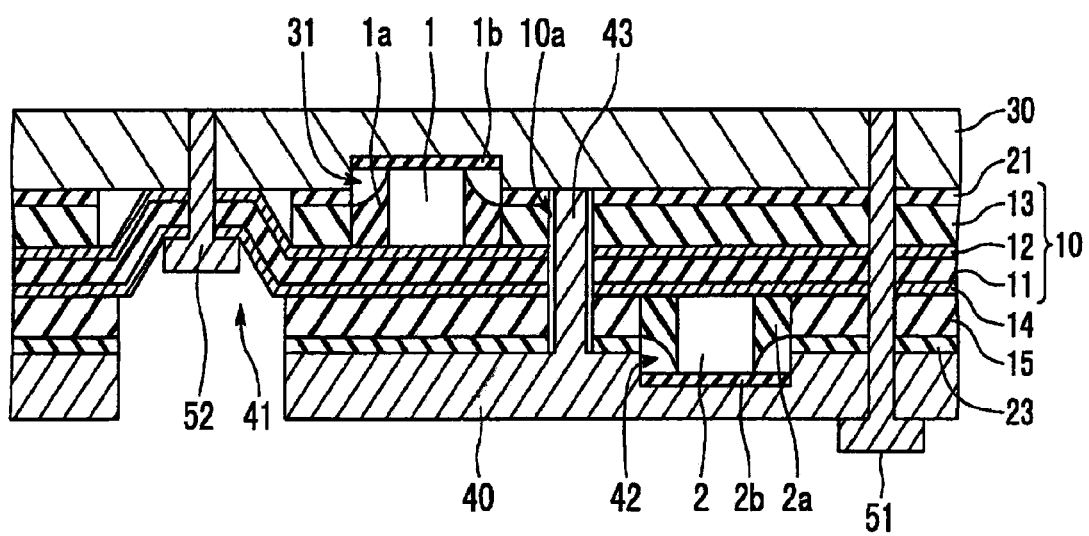
FIG. 6 is a sectional view for explaining a structure of a semiconductor device according to a sixth embodiment of the invention.

FIG. 6 is a sectional view illustrating a structure of a semiconductor device according to a sixth embodiment of the invention, and corresponds to FIG. 4 of the fourth embodiment. A semiconductor device according to the fourth embodiment is the same as that of the fourth embodiment except that the end portions of the first heat radiating plate 30 and the second heat radiating plate 40 are the same position of the first embodiment, the opening 10a is provided to the flexible substrate 10, and the spacer 43 is disposed at the position overlapping with the opening 10a and passes through the opening 10a to butt to the first heat radiating plate 30. Description of the same structure as that of the fourth embodiment is omitted.

The sixth embodiment can also provide the same advantageous effect as that of the fourth embodiment.

It should be understood that the above-mentioned embodiments and examples are not intended to limit the invention. Various changes and modifications can be made without departing from the spirit and scope of the invention. For example, in the above-described embodiments, the insulation layers 21 and 1b may not be included. In each of the second, fourth, and sixth embodiments, the insulation layers 23 and 2b may not be included. In addition, the substrate on which the semiconductor chip 1 and/or 2 is mounted is not necessarily a flexible substrate. Any substrates can be used as long as the substrates can be bended by the screw 52 so that the wiring pattern 12 makes contact with the first heat radiating plate 30.

Further, in the above-described embodiments, a pin may be used instead of the screws 51 and 52. In this case, a normal hole is formed to the first heat radiating plate 30 and the second heat radiating plate 40 instead of the screw hole.

What is claimed is:

1. A semiconductor device, comprising:
    a wiring substrate having a wiring pattern on a front surface thereof;
    a first semiconductor chip mounted on the front surface of the wiring substrate;
    a first heat radiator having a first recess housing the first semiconductor chip and being on the front surface of the wiring substrate and the first semiconductor chip;
    a second heat radiator on a rear surface of the wiring substrate; and
    a first fixing member passing through the first heat radiator, the wiring substrate, and the second heat radiator, and pressing the first heat radiator and the second heat radiator to the wiring substrate;
    wherein the wiring substrate has a second wiring pattern on the rear surface thereof, a second semiconductor chip mounted on the rear surface of the wiring substrate, and the second heat radiator having a second recess housing the second semiconductor chip; and the second semiconductor chip being on a bottom face of the second recess.

2. The semiconductor device according to claim 1, further comprising a second fixing member bending the wiring substrate so that the front surface of the wiring substrate makes contact with the first heat radiator, wherein: the wiring substrate is capable of being bended; the first heat radiator has electrical conductivity; and the front surface has a grounding wiring line at a part thereof with which the first heat radiator makes contact by the second fixing member.

3. The semiconductor device according to claim 1, wherein: each of the first heat radiator and the second heat radiator has an opposing portion that faces each other and is positioned outside an end portion of the wiring substrate; and one of the opposing portions of the first heat radiator and the second heat radiator has a spacer to keep a clearance between the first heat radiator and the second heat radiator by making contact with the other of the opposing portions of the first heat radiator and the second heat radiator.

4. The semiconductor device according to claim 1, further comprising:
    an opening provided to the wiring substrate; and
    a spacer having a protruded shape and being provided to one of the opposing portions of the first heat radiator and the second heat radiator to keep a clearance between the opposing portion of the first heat radiator and the second heat radiator by passing through the opening and making contact with the other of the opposing portions of the first heat radiator and the second heat radiator.

5. The semiconductor device according to claim 1, wherein: the first heat radiator makes contact with the wiring substrate with a first insulation layer; and the first insulation layer adheres to one of the first heat radiator and the wiring substrate.

* * * * *